(12) United States Patent
Hirata et al.

(10) Patent No.: US 11,311,966 B2
(45) Date of Patent: Apr. 26, 2022

(54) LASER PROCESSING MACHINE

(71) Applicant: HONDA MOTOR CO., LTD., Tokyo (JP)

(72) Inventors: Yuichi Hirata, Tochigi (JP); Yuki Sato, Tochigi (JP); Kenichiro Ono, Tochigi (JP); Masashi Koike, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 473 days.

(21) Appl. No.: 16/414,248

(22) Filed: May 16, 2019

(65) Prior Publication Data

US 2019/0358745 A1   Nov. 28, 2019

(30) Foreign Application Priority Data

May 24, 2018   (JP) .............................. JP2018-099318

(51) Int. Cl.
*B23K 26/08*   (2014.01)
*B23K 26/00*   (2014.01)
(Continued)

(52) U.S. Cl.
CPC ........ *B23K 26/0884* (2013.01); *B08B 7/0057* (2013.01); *B23K 26/0093* (2013.01);
(Continued)

(58) Field of Classification Search
CPC ............ B23K 26/0884; B23K 26/0093; B23K 26/0838; B23K 26/38; B23K 26/0876; B23K 37/04; B23K 37/0408; B23K 37/02235; B23K 26/123; B23K 26/0846; B23K 26/702; B23K 10/00; B23K 10/006; B23K 26/703; B23K 26/032; B23K 37/006; B23K 26/342; B23K 31/12; B23K 26/34; B23K 9/323; B23K 15/08; B23K 26/0626;
(Continued)

(56) References Cited

U.S. PATENT DOCUMENTS

2010/0310331 A1   12/2010 Inoue et al.
2013/0098876 A1*   4/2013 Kobayashi ......... B23K 37/0235
                                                                    219/68
2018/0193958 A1   7/2018 Ozeki

FOREIGN PATENT DOCUMENTS

CN   101878091 A   11/2010
CN   107708916 A   2/2018
(Continued)

*Primary Examiner* — Joel M Attey
*Assistant Examiner* — Rachel R Rizzo
(74) *Attorney, Agent, or Firm* — Rankin, Hill & Clark LLP

(57) ABSTRACT

A laser processing machine includes a guide member with which a laser head is engaged so as to be movable to one side in a conveying direction, a moving device configured to move the laser head along the guide member, a counterweight which is movably engaged to the other side of the guide member in the conveying direction and moves along the guide member in a direction opposite to a moving direction of the laser head in conjunction with the laser head moved by the moving device, and a control device which controls the moving device to move the counterweight to a position facing the grease feeding device and to perform grease feeding to an engaged portion between the counterweight and the guide member.

7 Claims, 10 Drawing Sheets

(51) Int. Cl.
  *B65G 47/74* (2006.01)
  *F16N 7/14* (2006.01)
  *C23C 16/48* (2006.01)
  *B08B 7/00* (2006.01)
  *B65G 45/02* (2006.01)

(52) U.S. Cl.
  CPC .......... *B23K 26/0838* (2013.01); *B65G 45/02* (2013.01); *B65G 47/74* (2013.01); *C23C 16/482* (2013.01); *F16N 7/14* (2013.01)

(58) Field of Classification Search
  CPC ...... B23K 9/04; B23K 26/082; B23K 10/027; B23K 15/0086; B23K 26/36; B23K 15/0026; B23K 26/50; B23K 26/0006; B23K 26/009; B23K 26/55; B23K 26/53; B23K 26/10; B23K 26/067; B23K 26/0624; B23K 26/18; B23K 37/047; B23K 26/0853; B23K 26/364; B23K 26/0622; B23K 26/0869; B23K 26/066; B23K 26/073; B23K 26/402; B23K 26/0604; B23K 26/0344; B23K 26/16; B23K 26/242; B23K 26/359; B23K 26/1224; B23K 26/046; B23K 26/083; B23K 26/0665; B23K 26/0821; B23K 26/03; B23K 26/128; B23K 26/12; B08B 7/0057; B08B 7/0035; B08B 3/10; B65G 45/02; B65G 47/74; C23C 16/482; F16N 7/14; F16N 11/08; F16N 29/02; F16N 19/00; B26D 7/0625; B26D 5/005; B25J 9/0084; B25J 9/1697; B25J 9/1612; B25J 15/0009; G01G 17/00; H01L 21/461; H01L 21/78; H01L 21/6836; H01L 21/6835; H01L 31/0463; H01L 31/18; H01L 21/82; H01L 21/68764; H01L 21/67092; H01L 21/68785; H01L 21/67051; H01L 21/6715; H01L 21/67115; H01L 51/0067; H01L 51/0072; G05B 19/406; G05B 15/02; B22F 10/20; B22F 12/00; B22F 3/003; B29C 64/20; B29C 64/153; B29C 73/24; B29C 64/209; B33Y 30/00; B33Y 40/00; B33Y 10/00; B33Y 80/00; G01N 21/73; G01N 21/33; G01N 29/46; G01N 21/1702; G01N 29/14; G01N 33/5011; G01N 33/5088; G01N 33/502; G01N 33/5008; G01N 33/6896; G01N 33/68; B05C 19/06; B05C 5/001; B23P 15/02; B23P 23/04; B05D 1/02; B05D 3/002; B05B 15/65; B05B 7/228; B05B 13/02; C03B 33/093; C03B 33/033; C03B 33/07; C03B 33/091; B28D 5/0094; B28D 5/0011; B28D 1/221; B28D 5/0058; F02M 61/168; C10M 173/02; C10M 119/22; C10M 147/04; C10M 107/38; C10M 169/06; F04D 29/063; F04D 17/16; F04D 27/00; H01S 3/036; G03G 15/2025; G03G 15/2064; F16C 33/6688; F16C 33/109; G16H 40/63; G16H 10/60; G16H 40/40; G16H 40/67; G16H 20/17; G06Q 50/22; G06Q 10/06312; G06Q 10/06; G09B 23/02; G06T 7/60; G06T 3/0093; G06T 7/20; G06T 5/50; G06T 7/0012; G06T 5/002; H04W 52/0235; H04W 28/0247; H04W 92/14; C07D 403/04; C07D 471/04; C07D 403/10; C07D 493/04; H04R 25/552; H04R 25/554; H04R 25/70; A61P 19/00; A61P 37/00; A61P 29/00; A61P 27/02; A61P 25/02; A61P 43/00; A61P 27/16; A61P 35/00; A61P 31/04; A61K 38/177; A61K 38/1774; C07K 16/18; C07K 14/47; C07K 14/71; C07K 14/4703; C07K 14/705; F16M 13/022; F16M 13/00; F16M 11/041; B65D 47/2018; G01F 11/30; G01F 1/661; F16K 7/04; F16K 7/06; F16K 1/00; F16K 31/02; F16K 27/00; A61M 5/14; A61M 39/281; A61M 5/14212; A61M 5/16881; A61M 5/1415; A61M 5/172; A61M 5/16804; A61M 5/16886; A61M 5/1689; A61M 5/1411; A61M 5/16877; F16B 2/02; G05D 7/0635; G06K 9/6201; G06K 9/2027; G06K 9/52; G06K 9/6215; G06K 9/40; H04N 7/183; C12N 15/85; A01K 67/0276; G06F 3/1273; G06F 3/1263; G06F 3/1217; G06F 3/1282; G06F 3/1261; C12P 17/181; C07H 15/203; G01R 23/00; G01R 31/34; H02P 27/045; H02P 23/14; C07G 11/00

See application file for complete search history.

(56) References Cited

FOREIGN PATENT DOCUMENTS

| | | | |
|---|---|---|---|
| JP | S59-094823 | A | 5/1984 |
| JP | H03-051717 | | 5/1991 |
| JP | 2013-086921 | | 5/2013 |
| JP | 2013086921 | A * | 5/2013 |

\* cited by examiner

FIG. 6
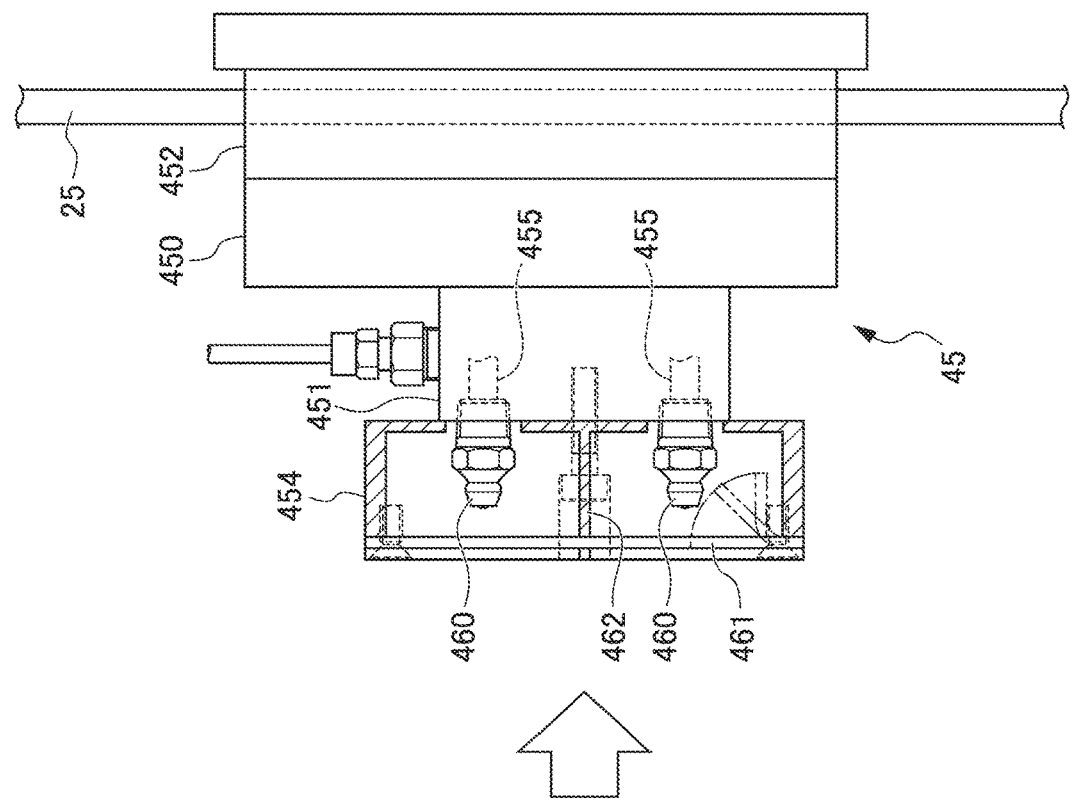
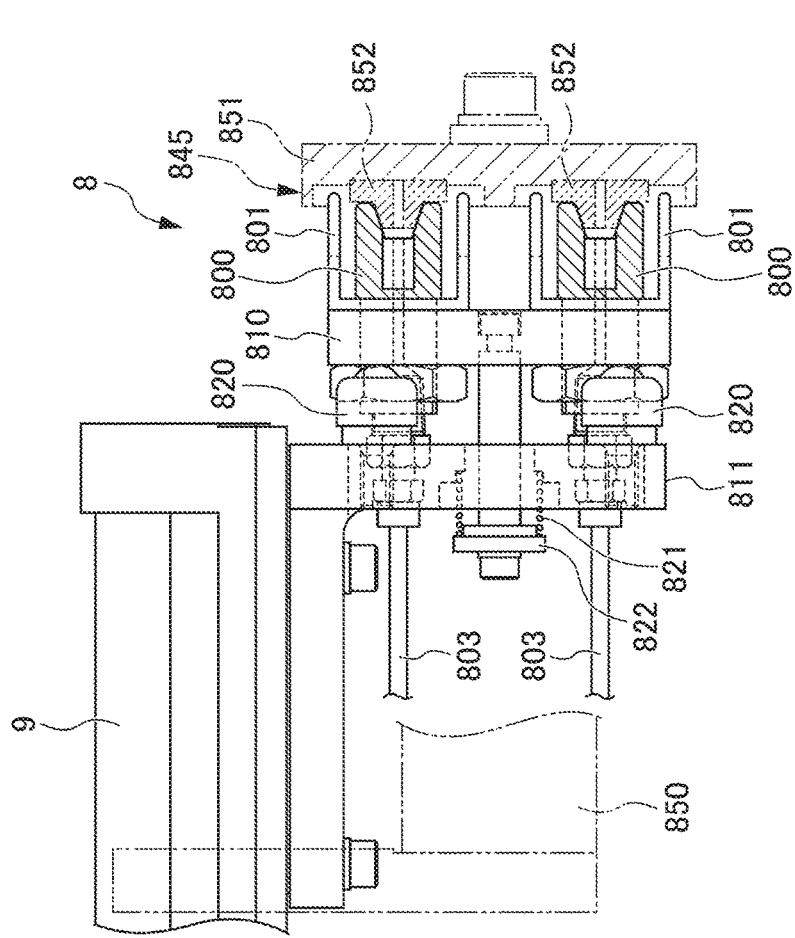

LASER PROCESSING MACHINE

This application is based on and claims the benefit of priority from Japanese Patent Application No. 2018-099318, filed on 24 May 2018, the content of which is incorporated herein by reference.

BACKGROUND OF THE INVENTION

Field of the Invention

The present invention relates to a laser processing machine in which a laser head moves along a guide member.

Related Art

In related art, there has been known a technique of moving the laser head that irradiates a workpiece to be processed with a laser, and performing laser processing such as cutting. For example, Patent Document 1 discloses a conveying device that includes an auxiliary shaft frame that extends in an auxiliary axis direction and holds an object to be conveyed so as to be movable in the auxiliary axis direction, and a main shaft frame that extends in a main axis direction intersecting the auxiliary axis direction and holds the auxiliary shaft frame so as to be movable in the main axis direction, and conveys the object to be conveyed in the main axis direction and the auxiliary axis direction. Patent Document 1 discloses that the conveyance device is equipped with a counterweight which is held by the auxiliary shaft frame so as to be movable in the auxiliary shaft direction, and moves in an opposite direction with respect to the movement in the auxiliary direction of the object to be conveyed at a position on the opposite side of the object to be conveyed across a center line of the auxiliary shaft frame in the auxiliary axis direction and on the opposite side of the auxiliary shaft frame in the main axis direction.

An apparatus that moves a moving body such as a laser head using an endless belt as illustrated in Patent Document 1 needs to supply lubricating oil at an appropriate timing. For example, Patent Document 2 discloses a grease feeding device which is arranged at a predetermined pitch in the trolley chain and is adapted to lubricate a trolley foil supported by a bracket via a nip portion. Patent Document 2 discloses that the grease feeding device is equipped with a movable body movable along a traveling direction of the trolley chain, a grease feeding nozzle attached to the moving body and capable of advancing and retracting toward and away from a nipple portion, and a control mechanism that controls advancing and retracting movement of the grease feeding nozzle.

Patent Document 1: Japanese Unexamined Patent Application, Publication No. 2013-86921

Patent Document 2: Japanese Unexamined Utility Model Application, Publication No. H3-51717

SUMMARY OF THE INVENTION

In the laser processing machine as described in Patent Document 1, the laser head and the counterweight, which are moving bodies, are configured to move in different directions in a state of being engaged with the guide rails, respectively. Therefore, it is necessary to perform grease feeding to each of the laser head and the counterweight. Regarding the laser head, although it is possible to utilize a path for performing the grease feeding by bundling electrical wires used for controlling the laser head and grease feeding tubes, wiring or the like is not connected to the counterweight that moves in different directions, and it is not possible to utilize the grease feeding path on the side of the laser head. Although it may be conceivable to connect the grease feeding tube to the counterweight, there is also the possibility that the tube is entangled with the wiring or tube on the laser head side due to the movement of the counterweight. For this reason, the grease feeding to the counterweights is carried out manually by a worker using a grease pump or the like, which is laborious work.

In this respect, the grease feeding device as described in Patent Document 2 also assumes the grease feeding to the trolley foil, and is difficult to cope with the grease feeding to the counterweight (moving body) moving in the different direction to the laser head.

An object of the present invention is to provide a laser processing machine for moving a laser head with a configuration capable of automatically performing the grease feeding to a counterweight interlocking with the laser head.

The present invention relates to a laser processing machine (for example, a laser blank device 1 to be described below) including: a workpiece conveying device (for example, a conveyor 10 to be described below) configured to convey a workpiece in a predetermined direction; a laser head (for example, a laser head 40 to be described below) configured to irradiate the workpiece with a laser; a guide member (for example, a first guide frame 21 to be described below) which extends in a direction intersecting a conveying direction of the workpiece and with which the laser head is engaged so as to be movable to one side in the conveying direction; a moving device (for example, a moving device 20 to be described below) configured to move the laser head along the guide member; a counterweight (for example, a counterweight 45 to be described below) which is movably engaged to the other side of the guide member in the conveying direction and moves along the guide member in a direction opposite to a moving direction of the laser head in conjunction with the laser head moved by the moving device; a grease feeding device (for example, a grease feeding device 8 to be described below) disposed on an opposite side of a processing area (for example, a processing area 100 to be described below) in which processing is performed by the laser head across the guide member; and a control device (for example, a control device 70 to be described below) which controls the moving device to move the counterweight to a position facing the grease feeding device and to perform grease feeding to an engaged portion between the counterweight and the guide member.

As a result, since the grease feeding device is located outside the moving range of the laser head that performs the laser processing on the workpiece, it is possible to achieve automation of the grease feeding to the counterweight, while reliably preventing collision between the moving device that moves the laser head during laser processing and the grease feeding device.

The laser processing machine may further include an inspection table (for example, an inspection table 65 to be described below) on which inspection of the laser head is performed, in which the grease feeding device may be disposed at a position corresponding to the counterweight when the laser head is at an inspection position at which inspection is performed on the inspection table.

Therefore, it is possible to perform grease feeding to the counterweight by the grease feeding device while the laser head inspection work is being performed on the inspection table, thereby improving the operating efficiency.

The laser processing machine may further include an ultraviolet irradiation device (for example, an ultraviolet irradiation device 50 to be described below) on which cleaning of the laser head is performed by ultraviolet irradiation, in which the grease feeding device may be disposed at a position corresponding to the counterweight when the laser head is at a cleaning position at which cleaning is performed by the ultraviolet irradiation device.

Therefore, it is possible to perform the grease feeding to the counterweight by the grease feeding device while the laser head is being cleaned by the ultraviolet irradiation device, thereby improving the operating efficiency.

It is preferable that the moving device be configured to be capable of moving the laser head in a three-dimensional direction.

As a result, it is possible to cope with various laser processing, while realizing a smooth movement of the counterweight by the grease feeding device.

The present invention relates to a laser processing machine (for example, a laser blank device 1 to be described below) including: a workpiece conveying device (for example, a conveyor 10 to be described below) configured to convey a workpiece (for example, the workpiece W) in a predetermined direction; a laser head (for example, a laser head 40 to be described below) configured to irradiate the workpiece with a laser; a guide member (for example, a first guide frame 21 to be described below) which extends in a direction intersecting a conveying direction of the workpiece and with which the laser head is engaged so as to be movable to one side in the conveying direction; a moving device (for example, a moving device 20 to be described below) configured to move the laser head along the guide member; a counterweight (for example, a counterweight 45 to be described below) which is movably engaged to the other side of the guide member in the conveying direction and moves along the guide member in a direction opposite to a moving direction of the laser head in conjunction with the laser head moved by the moving device; an inspection table (for example, an inspection table 65 to be described below) which is disposed at a side of the workpiece conveying device and on which inspection of the laser head is performed; an ultraviolet irradiation device (for example, an ultraviolet irradiation device 50 to be described below) which is disposed on an opposite side of the inspection table across the workpiece conveying device and on which cleaning of the laser head is performed by ultraviolet irradiation; and a grease feeding device (for example, a grease feeding device 8 to be described below) disposed diagonally across the guide member with respect to the inspection table or the ultraviolet irradiation device.

As a result, since the grease feeding device is located outside the moving range of the laser head that performs the laser processing on the workpiece, it is possible to achieve automation of the grease feeding to the counterweight, while reliably preventing collision between the moving device that moves the laser head during laser processing and the grease feeding device.

According to the laser processing machine of the present invention, it is possible to automatically perform grease feeding to the counterweight in conjunction with the laser head.

BRIEF DESCRIPTION OF THE DRAWINGS

FIG. 6 is a plan view illustrating a structure of a counterweight and a grease feeding device of the present embodiment.

DETAILED DESCRIPTION OF THE INVENTION

Figure 1:
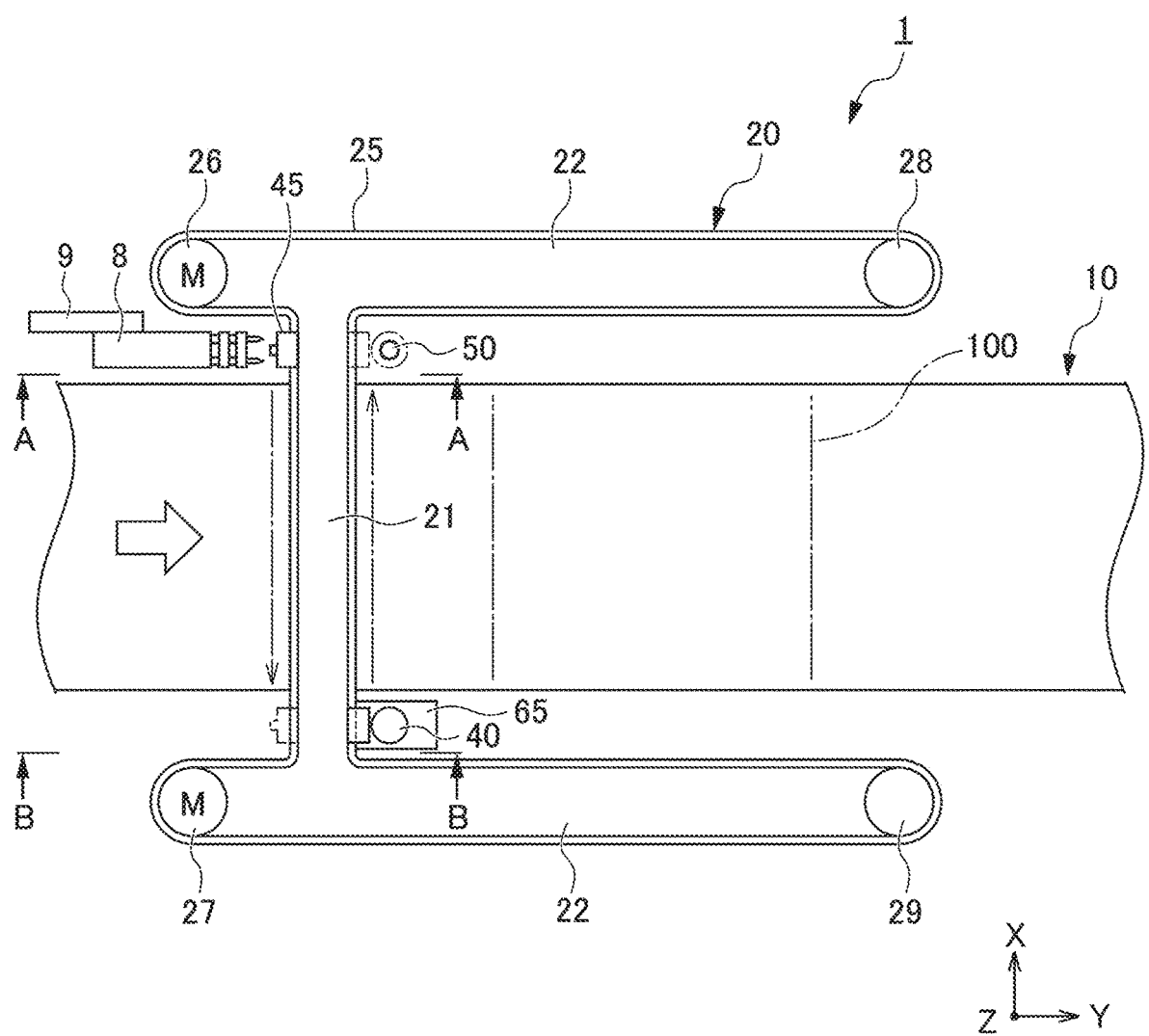
FIG. 1 is a plan view schematically illustrating a laser processing machine according to an embodiment of the present invention is applied.
Figure 2:
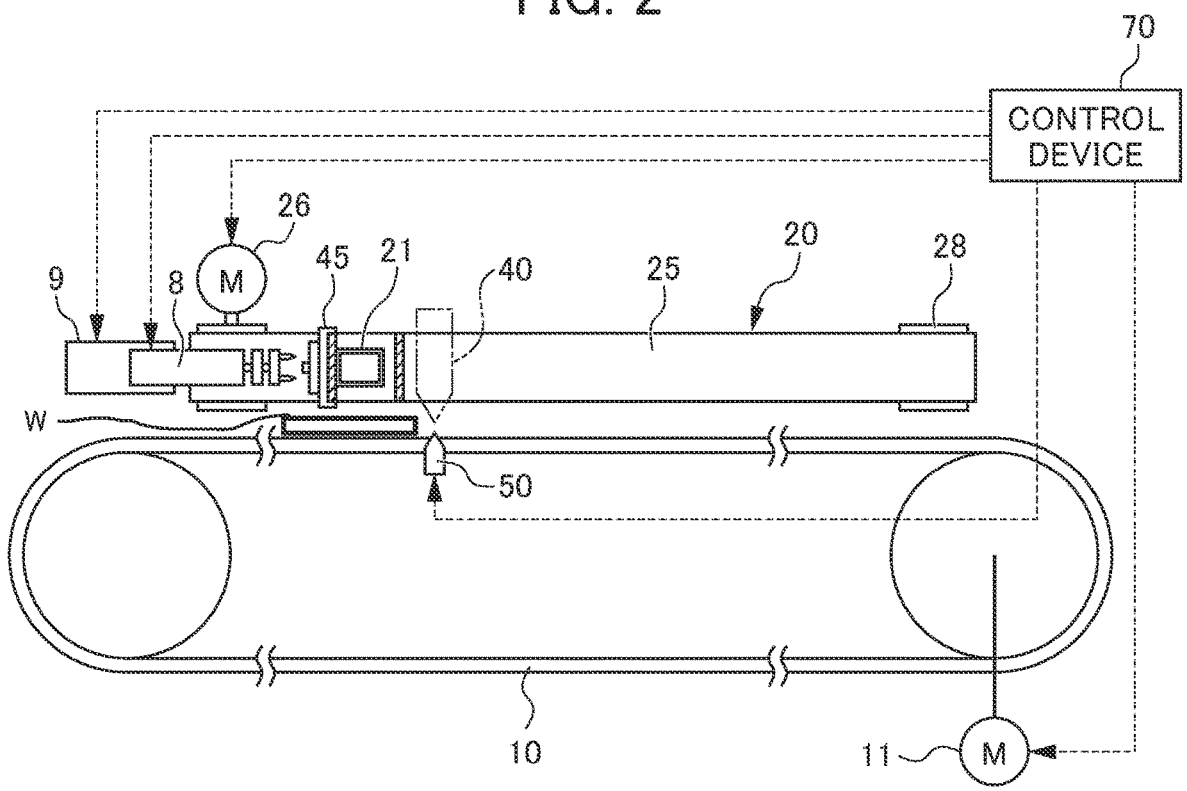
FIG. 2 is a cross-sectional view taken along the line A-A of FIG. 1 schematically illustrating a laser processing machine of the present embodiment.
Figure 3:
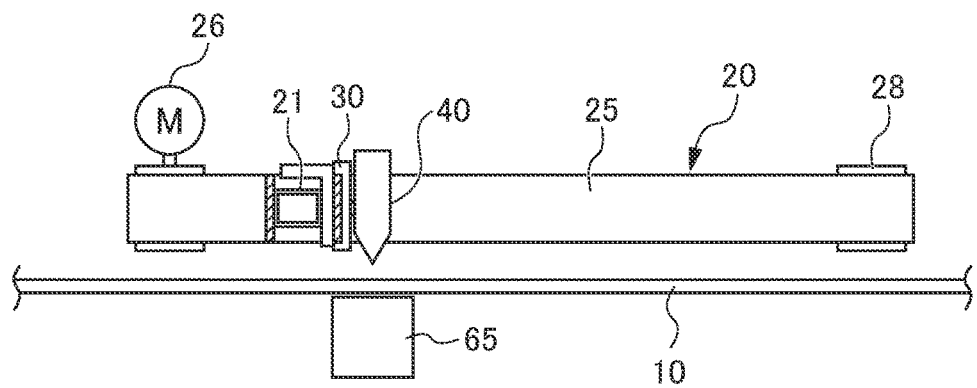
FIG. 3 is a cross-sectional view taken along the line B-B of FIG. 1 schematically illustrating the laser processing machine of the present embodiment.

Hereinafter, preferred embodiments of the present invention will be described with reference to the drawings. FIG. 1 is a plan view schematically illustrating a laser blank device 1 according to an embodiment of the present invention is applied. FIG. 2 is a cross-sectional view taken along the line A-A of FIG. 1 schematically illustrating a laser blank device 1 of the present embodiment, and FIG. 3 is a cross-sectional view taken along the line B-B of FIG. 1.

The laser blank device 1 illustrated in FIGS. 1 and 2 is used for a laser blanking system in which a workpiece W is cut with a laser according to different shapes depending on the object to be processed and sent to a subsequent process. The workpiece of the laser blank device 1 is, for example, a steel plate of a side panel for an automobile or the like.

First, an overall configuration of the laser blank device 1 will be described. The laser blank device 1 of the present embodiment includes a conveyor 10, a moving device 20, a laser head 40, a counterweight 45, an ultraviolet irradiation device 50, an inspection table 65, a grease feeding device 8, and a control device 70 as main configurations.

The conveyor 10 is a workpiece conveying device that conveys the workpiece W from an upstream side to a downstream side (a Y-axis direction in FIG. 1). The conveying direction is indicated by an outlined arrow in FIG. 1. In the following description, there are cases where a proximal end side of the arrow is described as the upstream side in the conveying direction and a distal end side of the arrow is described as the downstream side in the conveying direction.

The conveyor 10 is constituted by an endless belt that rotates by the driving force of a conveyor drive motor 11. In the present embodiment, a workpiece W having passed through an uncoiler and a leveler (both of which are not illustrated) is placed on the upper surface of the conveyor 10 and is conveyed to the processing position.

The moving device 20 is a moving device that supports the laser head 40 so as to be movable in the XYZ directions above the conveyor 10.

The moving device 20 of the present embodiment includes a first guide frame 21 extending in a direction (an X-axis direction) orthogonal to the conveying direction of the conveyor 10, a pair of second guide frames 22 which supports the conveyor so as to be movable in the conveying direction (a Y-axis direction) of the conveyor 10, an endless belt 25 wrapped around the side surfaces of the first guide frame 21 and the second guide frame 22, servo motors 26 and 27 which drive the endless belt 25, pulleys 28 and 29 rotating on the inside of the endless belt 25, and an elevating mechanism 30 fixed to the endless belt 25 and supporting the laser head 40.

The endless belt 25 is wound in a substantially H shape in a plan view, and by combination of the rotation of the servo motors 26 and 27, the laser head 40 held by the elevating mechanism 30 can move in a planar direction (an XY direction). In the present embodiment, the laser processing using the laser head 40 is performed inside a processing area 100 indicated by a chain line. It is to be noted that the processing area 100 is an example, and the area in which the laser processing is performed is not limited to that range.

For example, by controlling the two servo motors 26 and 27 at the same speed with the same rotational direction, the endless belt 25 moves in the same direction as the rotational direction of the servo motors 26 and 27, and the laser head 40 held by the elevating mechanism 30 moves in the X-axis direction. At this time, the first guide frame 21 does not move in the Y-axis direction due to the equilibrium of rotational speeds of the two servo motors 26 and 27. Further, when moving the first guide frame 21 in the Y-axis direction, the servo motor 26 (or the servo motor 27) on one side is rotated clockwise at a predetermined speed, and the servo motor 27 (or the servo motor 26) on the other side is rotated counterclockwise at the same predetermined speed. Therefore, the laser head 40 held by the elevating mechanism 30 moves in the Y-axis direction depending on the rotational direction of the servo motors 26 and 27. At this time, the laser head 40 does not move in the X-axis direction due to the equilibrium of the predetermined speed. It is also possible to move the laser head 40 in the Y-axis direction, while moving in the X-axis direction by controlling the rotational directions and the rotational speeds of the servo motors 26 and 27.

Figure 4:
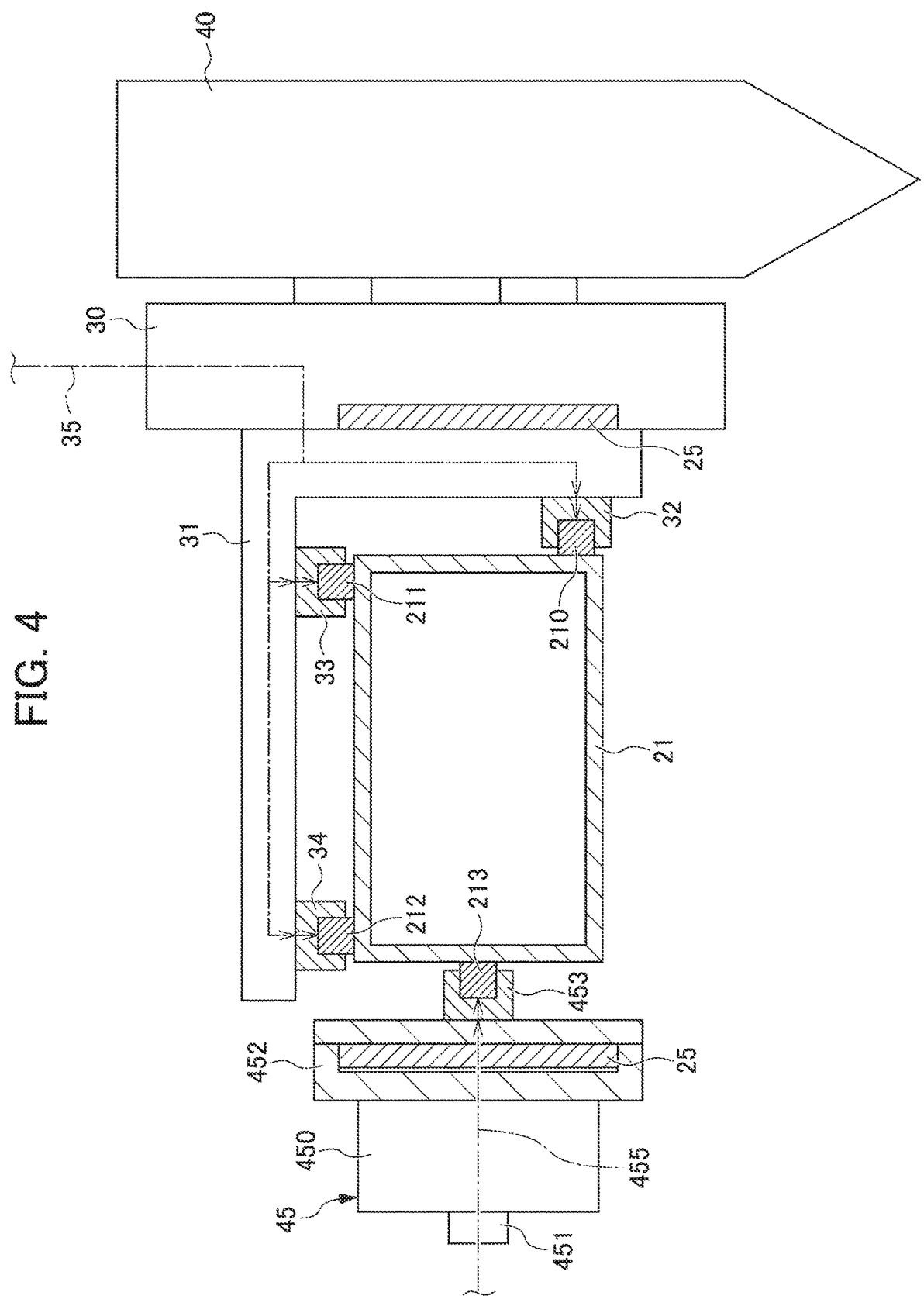
FIG. 4 is an enlarged sectional view schematically illustrating a configuration of a laser head and a counterweight according to the present embodiment.

Next, the configuration of the laser head 40 and the counterweight 45 will be described. FIG. 4 is an enlarged sectional view schematically illustrating the configuration of the laser head 40 and the counterweight 45 of the present embodiment.

The laser head 40 radiates a laser beam to the workpiece placed on and conveyed by the conveyor 10 to cut and process the workpiece W in a preset shape. In cutting using the laser, the workpiece W (a steel plate) is locally melted by a laser, and the molten metal is eliminated by $N_2$ as a cutting gas, thereby fusing the workpiece W without oxidation.

Movement of the laser head 40 in a vertical direction (a Z direction) is performed by the elevating mechanism 30. The servo motors 26 and 27 and the elevating mechanism 30 allow the laser head 40 to move in three dimensions (the XYZ directions).

The elevating mechanism 30 includes an L-shaped base 31 fixed to the first guide frame 21 side of the elevating mechanism 30, and a plurality of guides 32, 33, and 34 provided on a surface of the L-shaped base 31 facing the first guide frame 21. The elevating mechanism 30 and the L-shaped base 31 are fixed to the endless belt 25.

The plurality of guides 32, 33, and 34 are engaged with a plurality of rails 210, 211, and 212 provided in the first guide frame 21, respectively. Each of the plurality of rails 210, 211, and 212 extends in the X-axis direction.

The lubricating oil is supplied to the engaged portions between the plurality of guides 32, 33, and 34 and the plurality of rails 210, 211, and 212 from a grease feeding path 35 on the side of the laser head 40. The grease feeding path 35 is indicated by a chain line in FIG. 4, however, for example, a tubular member such as a tube is applied, and the grease feeding path 35 is connected to the L-shaped base 31 in a state of being bundled together with a wiring (not illustrated) connected to the laser head 40 or the elevating mechanism 30.

The counterweight 45 is held so as to be movable in the X-axis direction with respect to the first guide frame 21. The weight of the counterweight 45 is set on the basis of the weight of the laser head 40, the elevating mechanism 30, and the like.

The counterweight 45 includes a weight main body 450, a grease feeding unit 451 provided in the weight main body 450, a weight base 452 for fixing the weight main body 450 to the endless belt 25, and a guide 453 provided on the surface of the frame side of the weight base 452.

The guide 453 is engaged with a rail 213 provided in the first guide frame 21. The rail 213 extends in the X-axis direction.

In a state in which the guide 453 is engaged with the rail 213, the counterweight 45 moves in the direction opposite to the X-axis direction in conjunction with the movement of the laser head 40 in the X-axis direction. By the counterweight 45, it is possible to reduce a difference in inertial weight between both end portions of the first guide frame 21 when the laser head 40 moves from a state of being located on one side to the other side in the X-axis direction, and the movement of the laser head 40 can be stabilized.

The lubricating oil is supplied to the engaged portion between the guide 453 and the rail 213 from a grease feeding path 455 of a system different from the grease feeding path 35 on the side of the laser head 40. The grease feeding path 455 is formed inside the weight main body 450 and the weight base 452. The lubricating oil is supplied to the grease feeding path 455 from the grease feeding device 8 to be described below. Further, the configuration relating to the grease feeding of the counterweight 45 will be described below.

As illustrated in FIG. 1, the ultraviolet irradiation device 50, the inspection table 65, and the grease feeding device 8 according to the present embodiment are disposed on the side of the conveyor 10 that does not overlap the workpiece conveying path and the processing area 100. Among them, the ultraviolet irradiation device 50 and the inspection table 65 are located on the side of the processing area 100, and the grease feeding device 8 is located on the upstream side in the conveying direction than the ultraviolet irradiation device 50 and the inspection table 65.

The ultraviolet irradiation device 50 is a cleaning apparatus that cleans optical components of the laser head 40 by ultraviolet irradiation. The laser head 40 moves to a cleaning position (a position indicated by the chain line in FIG. 1) by the moving device 20. In a state in which the laser head 40 moves to the cleaning position, ultraviolet rays from the ultraviolet irradiation device 50 are radiated to decompose contamination adhering to the protective glass 44.

In the present embodiment, the ultraviolet irradiation device 50 in which a xenon Hg lamp having an ultraviolet wavelength of 254 nm (a range of 200 to 600 nm), a rating of 280 VA and an ultraviolet illuminance of 3,500 mW/cm$^2$ is set as a light source is used. The xenon Hg lamp has many long wavelength UV components and can transmit optical fibers, which is preferable in terms of mounting in equipment.

The inspection table 65 is located on the side opposite to the X-axis direction of the ultraviolet irradiation device 50 with the conveyor 10 interposed therebetween. In the inspection table 65, an inspection work such as a burn pattern measurement, a laser output measurement, and brush cleaning for detecting the presence or absence of scratches or contamination on the lens is performed at the time of start of processing or when a cut failure occurs.

The grease feeding device 8 is for supplying the lubricating oil to the counterweight 45. The grease feeding device 8 is at a position facing the grease feeding unit 451 of the counterweight 45 when the laser head 40 is on the inspection table 65, and is disposed diagonally across the first guide frame 21 with respect to the inspection table 65. The laser head 40 is located on the processing area 100 side of the first guide frame 21. On the other hand, the counterweight 45 is located on the side opposite to the laser head 40. Therefore, the grease feeding device 8 is located on the side of the conveyor 10 on the side opposite to the processing area 100 side of the first guide frame 21, and on a diagonal side of the inspection table 65 when the X-axis direction of the first guide frame 21 in a plan view is set as a center line. Incidentally, the configuration of the grease feeding device 8 itself will be described below.

The grease feeding device 8 further includes a drive device 9 which moves the space between a standby position and a grease feeding position in the Y-axis direction. The grease feeding position is a position at which the distal end of the grease feeding device 8 is connected to the grease feeding unit 451 of the counterweight 45 when the counterweight 45 is at a position facing the grease feeding device 8 in the Y-axis direction. The standby position is a position retracted away from the first guide frame 21 in the Y-axis direction from the grease feeding position. The operation of the drive device 9 is controlled by the control device 70.

The control device 70 is a computer including a CPU, a memory, a storage device, and the like, and is electrically connected to the respective components of the laser blank device 1. The control device 70 controls the movement or laser irradiation of the laser head 40 by the moving device 20, conveyance of the conveyor 10, and the cleaning process or the grease feeding process by the ultraviolet irradiation device 50, and the like. The control device 70 according to the present embodiment controls the grease feeding device 8 to perform the grease feeding process during the inspection work on which the laser head 40 is located above the inspection table 65. The drive device 9 is controlled by the control device 70 so that the grease feeding device 8 moves from the standby position to the grease feeding position in a state in which the counterweight 45 is at a position facing the grease feeding device 8 in the Y-axis direction. That is, the grease feeding work is performed during the inspection work.

Figure 5:
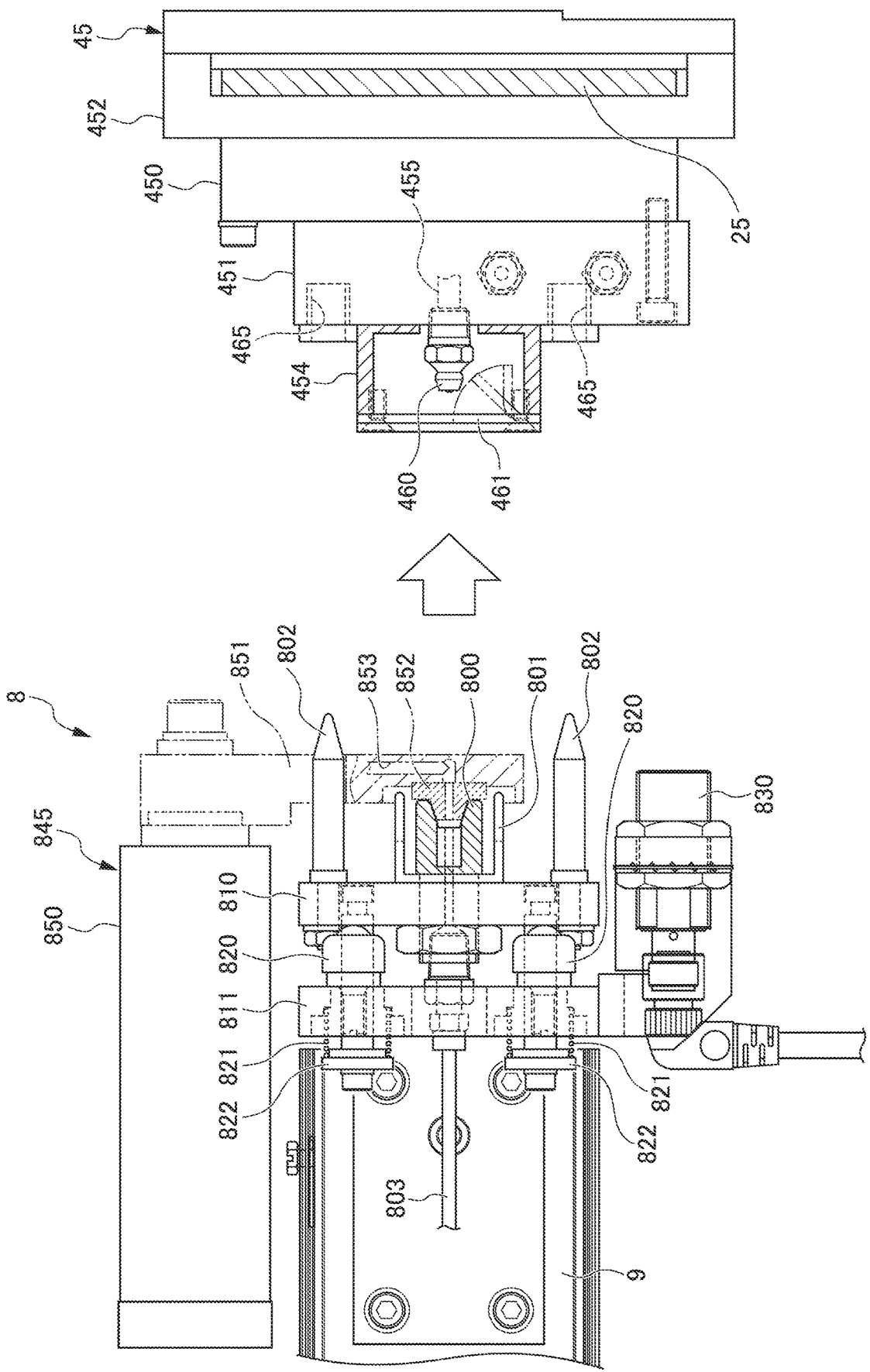
FIG. 5 is a side view illustrating a structure of a counterweight and a grease feeding device of the present embodiment.

Next, an example of the structure relating to the grease feeding of the counterweight 45 and the grease feeding device 8 will be described. FIG. 5 is a side view illustrating the structure of the counterweight 45 and the grease feeding device 8 according to the present embodiment, and FIG. 6 is a plan view thereof.

First, the grease feeding structure of the counterweight 45 will be described. As illustrated in FIG. 5, a nipple 460, a cover 454 for covering the nipple 460, and a positioning hole 465 are formed on a surface on the upstream side in the conveying direction of the grease feeding unit 451.

The nipple 460 is a connecting portion with the grease feeding device 8, and is formed in a convex shape. The nipple 460 is connected to the grease feeding path 455, and the lubricating oil is supplied to the engaged portion between the guide 453 and the rail 213 through the nipple 460. As illustrated in FIG. 6, the nipples 460 are disposed in two (a plurality of) places at intervals in the X-axis direction. Further, a partition wall 462 for partitioning the two nipples 460 is formed inside the cover 454.

Figure 7:
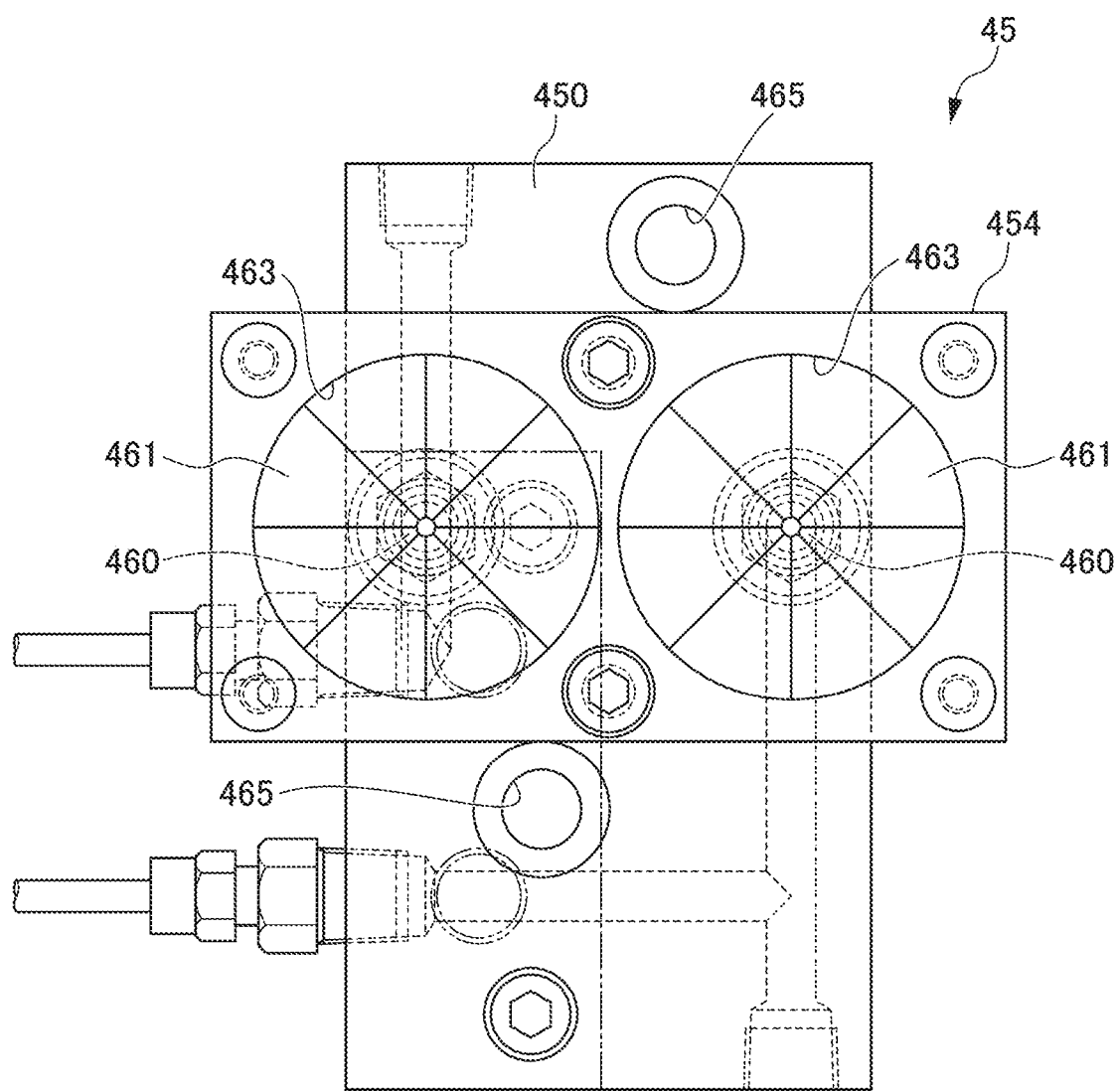
FIG. 7 is a view of a counterweight according to the present embodiment, as viewed from an upstream side in a conveying direction.

FIG. 7 is a view of the counterweight 45 according to the present embodiment as viewed from the upstream side in the conveying direction. As illustrated in FIG. 7, an opening portion 463 is formed at a position corresponding to the nipple 460 on a surface on the upstream side in the conveying direction of the cover 454. A slit rubber cover 461 is disposed in a plurality of opening portions 463. The space inside the cover 454 is separated from the outside by the slit rubber cover 461.

A plurality of slits is formed in the slit rubber cover 461. The plurality of slits extends radially outward from the center around a position at which the center of the nipple 460 overlaps when viewed in the conveying direction of the slit rubber cover 461.

The positioning hole 465 is used for positioning with the connection of the grease feeding device 8 to be described below. The positioning holes 465 are formed in two places on each of the upper and lower sides of the cover 454. The upper and lower positioning holes 465 have a positional relation shifted in position in a left-right direction (the X-axis direction).

Next, the grease feeding structure of the grease feeding device 8 will be described. The grease feeding device 8 includes a nozzle 800, a base plate 810, a rubber cover pressing ring 801, a positioning pin 802, a driving side connecting unit 811, a nozzle seating sensor 830, and a nozzle cover device 845.

The nozzle 800 is a connecting portion with the nipple 460 of the counterweight 45, and is formed in a concave shape. The lubricating oil is supplied to the nozzle 800 from the outside through the tube 803. As illustrated in FIG. 6, the nozzles 800 are disposed in two (a plurality of) places at intervals in the X-axis direction, and correspond to the position of the nipple 460.

The nozzle 800 is supported by the base plate 810. The rubber cover pressing ring 801 and the positioning pin 802 are disposed on a surface on the downstream side in the conveying direction of the base plate 810. The rubber cover pressing ring 801 is a member which presses the slit rubber cover 461 when connecting the nozzle 800 and the nipple 460. The positioning pin 802 is a member that determines the connection positions of the nozzle 800 and the nipple 460, and the distal end thereof is formed in a tapered shape.

Figure 8:
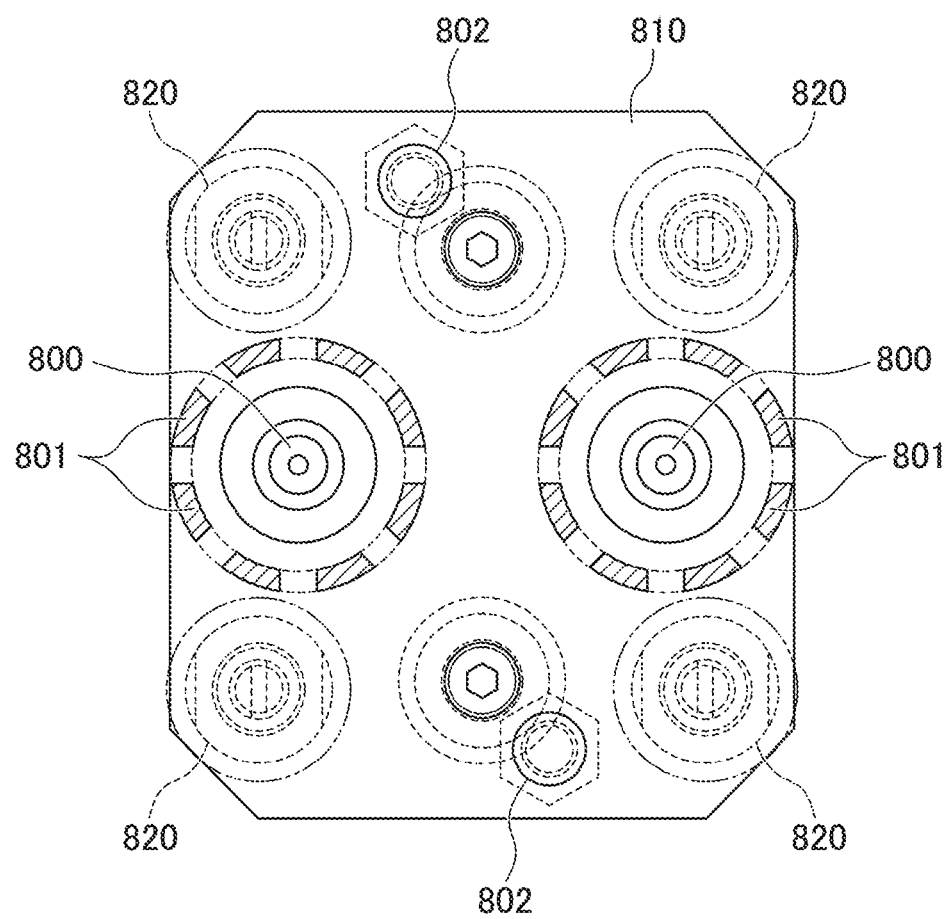
FIG. 8 is a view of the grease feeding device of the present embodiment, as viewed from a downstream side in the conveying direction.

FIG. 8 is a view of the grease feeding device 8 according to the present embodiment, as viewed from the downstream side in the conveying direction. As illustrated in FIG. 8, the rubber cover pressing rings 801 are disposed in two places according to the nozzle 800. Each rubber cover pressing ring 801 is configured by arranging a plurality of claws at equal intervals in a circular shape surrounding the respective nozzles 800. The claw of the rubber cover pressing ring 801 is disposed at a position coming into contact with space between the slit and the slit of the slit rubber cover 461.

The driving side connecting unit 811 is connected to the drive device 9 and moves in the Y-axis direction. The driving side connecting unit 811 includes a spring 821 as an elastic member, and a float support unit 822 connected to the base plate 810 via the spring 821, and supports the base plate 810 in a float shape.

Further, a plurality of protrusions 820 facing the surface on the upstream side in the conveying direction of the base plate 810 are provided on the surface on the downstream side in the conveying direction of the driving side connecting unit 811. The distal end portion of the protrusion 820 is a rotatable ball. The base plate 810 according to the present embodiment is a rectangular plate material with chamfered corners, and a total of four protrusions 820 are disposed in the vicinity of the four corners of the base plate 810, respectively.

The nozzle seating sensor 830 is a sensor for determining the connection state between the nozzle 800 and the nipple 460. The signal detected by the nozzle seating sensor 830 is transmitted to the control device 70, and the connection state between the nozzle 800 and the nipple 460 is determined.

Figure 9:
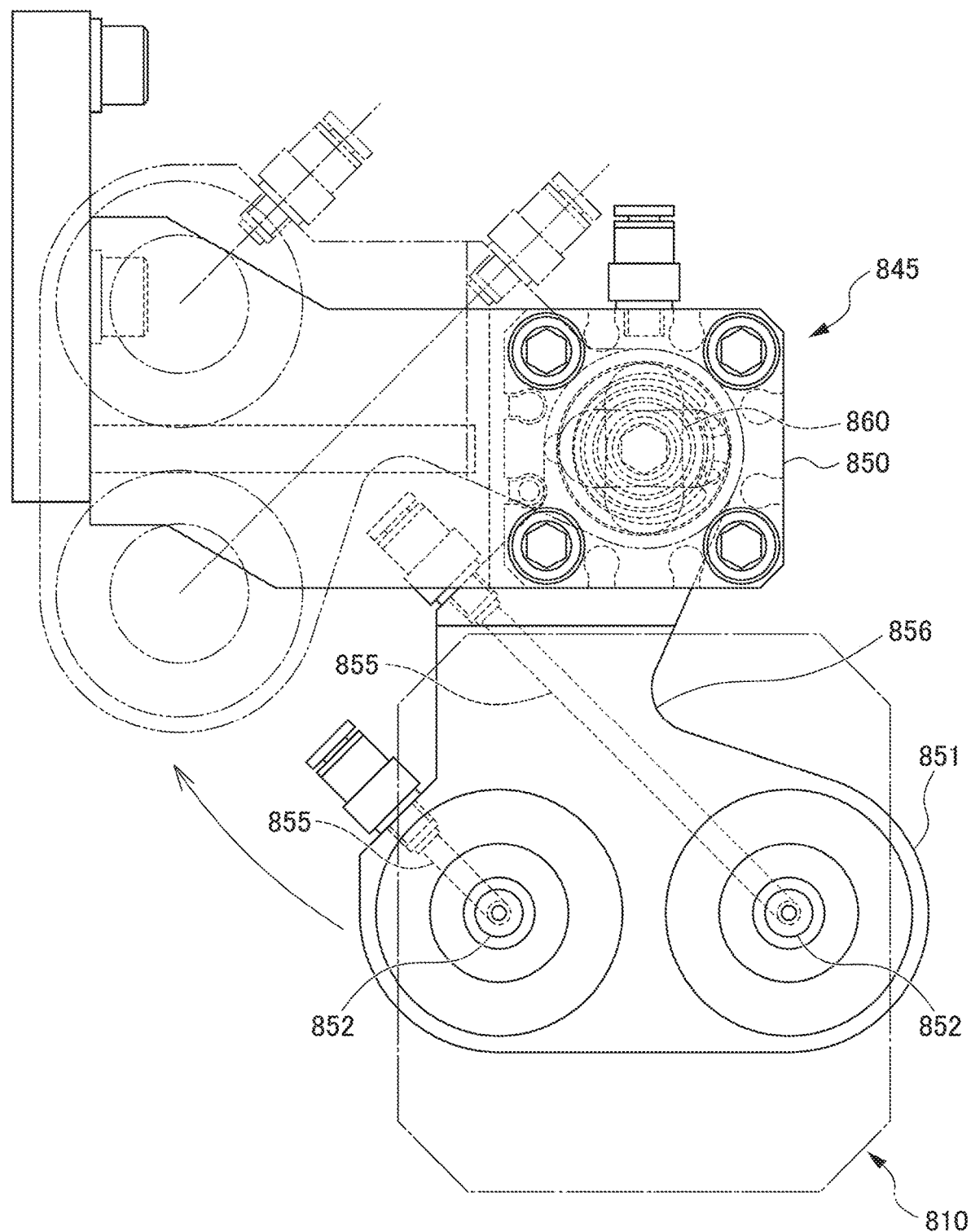
FIG. 9 is a view of a nozzle cover device of the present embodiment, as viewed from the upstream side in the conveying direction.

The nozzle cover device 845 includes a cover drive device 850 and a nozzle dustproof cover 851. FIG. 9 is a view of the nozzle cover device 845 according to the present embodiment as viewed from the upstream side in the conveying direction.

The cover drive device 850 is a cylinder mechanism having a connecting shaft 860 connected to the nozzle dustproof cover 851.

The nozzle dustproof cover 851 is configured to be movable between a cover position for covering the distal end of the nozzle 800 and a standby position for releasing the connection with the nozzle 800. The nozzle dustproof cover 851 is formed with a notch portion 856 for avoiding interference with the positioning pin 802. The nozzle dustproof cover 851 includes a cap 852 for closing the distal end of the nozzle 800 at the standby position, and a discharge path 853 for discharging the lubricating oil that cannot be supplied to the counterweight 45 in the grease feeding work. The caps 852 of the nozzle dustproof cover 851 are disposed in two places according to the number of the nozzles 800. A tube 855 for feeding the lubricating oil having flowed to the discharge path 853 to the outside is connected to each of the two caps 852.

The cover drive device 850 rotates the connecting shaft 860 on the basis of the operation command from the control device 70 to move the nozzle dustproof cover 851 from the cover position to the standby position and from the standby position to the cover position.

Next, the grease feeding process by the grease feeding device 8 will be described. In the state illustrated in FIG. 1 in which the counterweight 45 faces the grease feeding device 8 in the conveying direction, upon receiving the command of the grease feeding process start, the control device 70 controls the drive device 9 and the cover drive device 850 to move the grease feeding device 8 to the downstream side in the conveying direction (the direction of the void arrow in FIGS. 5 and 6), and to move the nozzle dustproof cover 851 from the cover position to the standby position.

When the grease feeding device 8 comes close to the counterweight 45, the two positioning pins 802 enter each of the two positioning holes 465 of the counterweight 45, thereby performing positioning the base plate 810 held in a float shape. Since the positioning pin 802 is formed in a tapered shape, even if the grease feeding device 8 is displaced in the conveying direction with respect to the counterweight 45, the positioning pin 802 enters the positioning hole 465, thereby also modifying the positional deviation thereof. As a result, even when the endless belt 25 extends due to aging or the like, it is possible to appropriately align the grease feeding device 8 and the counterweight 45.

When the grease feeding device 8 comes closer to the counterweight 45, the rubber cover pressing ring 801 pushes the slit rubber cover 461, and the nozzle 800 enters the inside of the cover 454.

Figure 10:
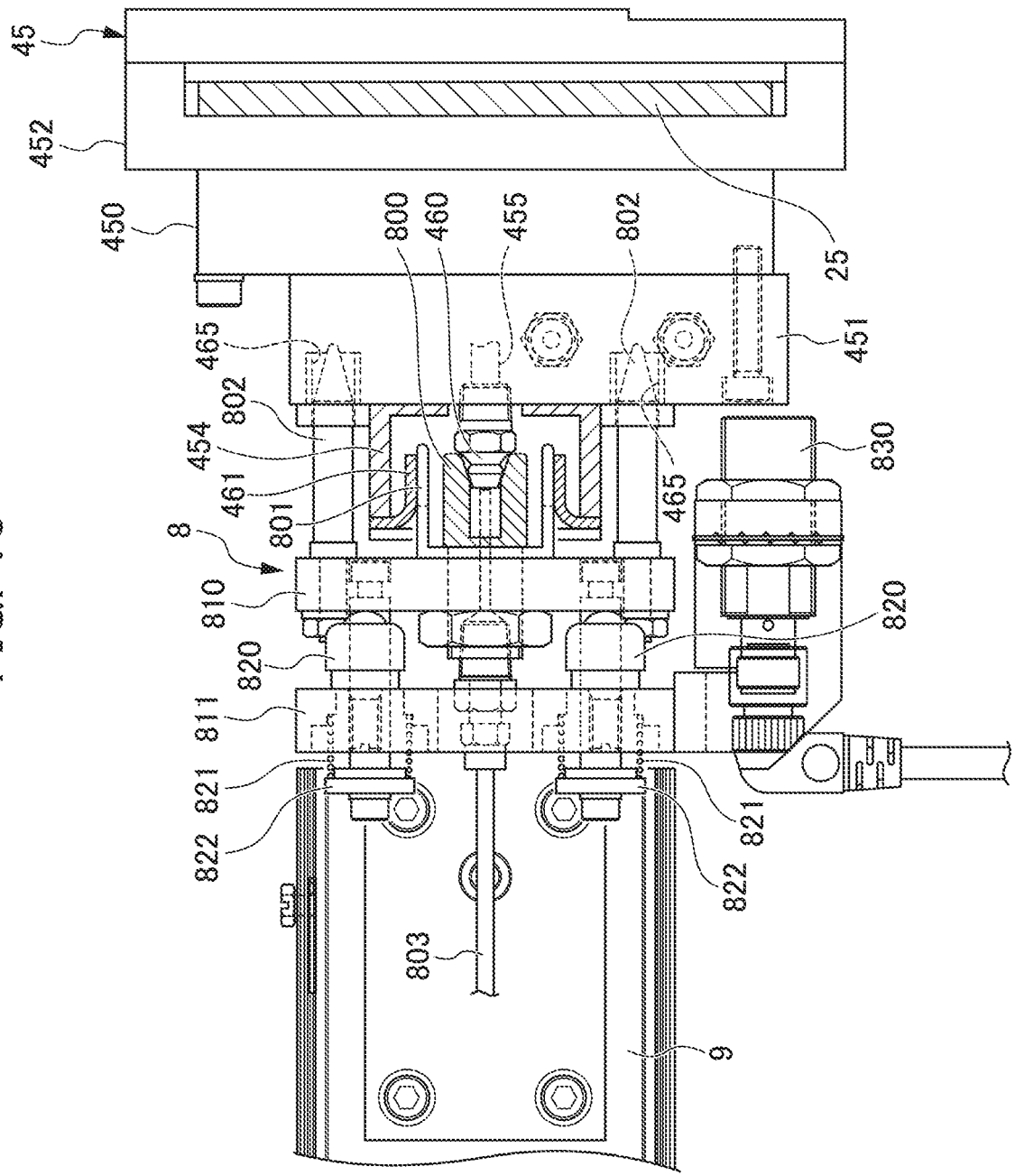
FIG. 10 is a side view illustrating a state in which the grease feeding device and the counterweight according to the present embodiment are connected to each other.
Figure 11:
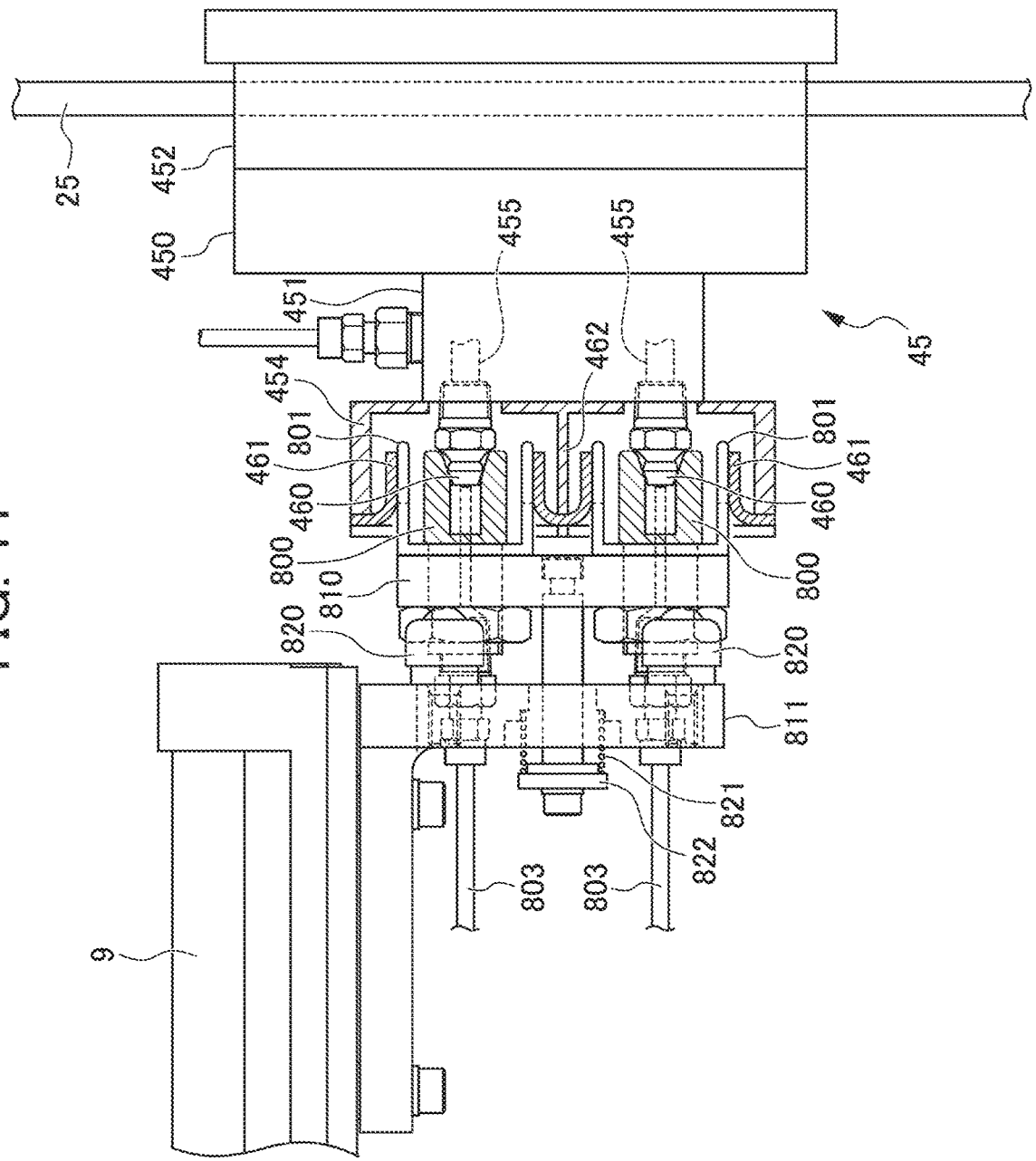
FIG. 11 is a plan view illustrating a state in which the grease feeding device and the counterweight according to the present embodiment are connected to each other.

FIG. 10 is a side view illustrating a state in which the grease feeding device 8 and the counterweight 45 according to the present embodiment are connected to each other, and FIG. 11 is a plan view thereof. As illustrated in FIGS. 10 and 11, as the nozzle 800 is fitted to the nipple 460, the grease feeding device 8 and the counterweight 45 are brought into a connected state. In this state, the lubricating oil is supplied to the counterweight 45. The connected state can be determined by the control device 70 by the signal of the nozzle seating sensor 830.

According to the present embodiment described above, the following effects are obtained. The laser blank device 1 includes a conveyor (a workpiece conveying device) 10, a laser head 40, a first guide frame (a guide member) 21 which extends in a direction orthogonal (intersecting) to the conveying direction of the workpiece workpiece W) and with which the laser head 40 is engaged so as to be movable to one side in the conveying direction, a moving device 20 which moves the laser head 40 along the first guide frame 21, a counterweight 45 which is movably engaged to the other side of the first guide frame 21 in the conveying direction and moves along the first guide frame 21 in a direction opposite to the moving direction of the laser head 40 in conjunction with the laser head 40 moved by the moving device 20, a grease feeding device 8 disposed on the opposite side of a processing area 100 across the first guide frame 21, and a control device 70 which controls the moving device 20 to move the counterweight 45 to the position facing the grease feeding device 8 such that grease feeding is performed to an engaged portion between the counterweight 45 and the first guide frame 21. Thus, since the grease feeding device 8 is located outside the moving range of the laser head 40 that performs the laser processing on the workpiece W, it is possible to achieve automation of the grease feeding to the counterweight 45, while reliably preventing collision between the moving device 20 that moves the laser head 40 during laser processing and the grease feeding device 8.

Further, the laser blank device 1 according to the present embodiment further includes an inspection table 65 on which inspection of the laser head 40 is performed. The grease feeding device 8 is disposed at a position corresponding to the counterweight 45 when the laser head 40 is at an inspection position at which inspection is performed on the inspection table 65. Therefore, it is possible to perform grease feeding to the counterweight by the grease feeding device while the inspection work of the laser head is being performed on the inspection table, thereby improving the operating efficiency.

Further, in the present embodiment, the ultraviolet irradiation device 50 is disposed on the opposite side of the inspection table 65 across the conveyor 10. Therefore, automatic cleaning of the laser head 40 can be realized by the ultraviolet irradiation device.

Further, the moving device 20 according to the present embodiment is configured to be capable of moving the laser head 40 in a three-dimensional direction. As a result, it is possible to cope with various laser processing, while realizing the smooth movement of the counterweight 45 by the grease feeding device 8.

Although the preferred embodiments of the present invention have been described above, the present invention is not limited to the above-described embodiments and can be appropriately modified. For example, the positions of the ultraviolet irradiation device 50 and the inspection table 65 may be exchanged, and the grease feeding device 8 may be installed on the opposite side of the position of the above embodiment across the conveyor 10.

It is also possible to change the configuration in which the grease feeding device 8 is disposed at a position corresponding to the counterweight 45 when the laser head 40 is at the cleaning position at which the cleaning is performed by the ultraviolet irradiation device 50. Therefore, it is possible to perform the grease feeding to the counterweight 45 by the grease feeding device 8 while the laser head 40 is being cleaned by the ultraviolet irradiation device 50, thereby improving the operating efficiency. In this manner, the installation position of the grease feeding device 8 can be appropriately changed depending on circumstances.

EXPLANATION OF REFERENCE NUMERALS

1 LASER BLANK DEVICE (LASER PROCESSING MACHINE)
8 GREASE FEEDING DEVICE
10 CONVEYOR (WORKPIECE CONVEYING DEVICE)
20 MOVING DEVICE (MOVING DEVICE)
21 FIRST GUIDE FRAME (GUIDE MEMBER)
40 LASER HEAD
45 COUNTERWEIGHT
50 ULTRAVIOLET IRRADIATION DEVICE
65 INSPECTION TABLE
70 CONTROL DEVICE

What is claimed is:
1. A laser processing machine comprising:
   a workpiece conveying device configured to convey a workpiece in a predetermined direction;
   a laser head configured to irradiate the workpiece with a laser;
   a guide member which extends in a direction intersecting a conveying direction of the workpiece and with which the laser head is engaged so as to be movable to one side in the conveying direction;
   a moving device configured to move the laser head along the guide member;
   a counterweight which is movably engaged to the other side of the guide member in the conveying direction and moves along the guide member in a direction opposite to a moving direction of the laser head in conjunction with the laser head moved by the moving device;
   a grease feeding device disposed on an opposite side of a processing area in which processing is performed by the laser head across the guide member; and
   a control device which controls the moving device to move the counterweight to a position facing the grease feeding device and to perform grease feeding to a portion at which the counterweight engages the guide member.

2. The laser processing machine according to claim 1, further comprising:
   an inspection table on which inspection of the laser head is performed,
   wherein the grease feeding device is disposed at a position corresponding to the counterweight when the laser head is at an inspection position at which inspection is performed on the inspection table.

3. The laser processing machine according to claim 1, further comprising:
   an ultraviolet irradiation device on which cleaning of the laser head is performed by ultraviolet irradiation,
   wherein the grease feeding device is disposed at a position corresponding to the counterweight when the laser head is at a cleaning position at which cleaning is performed by the ultraviolet irradiation device.

4. The laser processing machine according to claim 1, wherein the moving device is configured to move the laser head in a three-dimensional direction.

5. The laser processing machine according to claim 2, wherein the moving device is configured to move the laser head in a three-dimensional direction.

6. The laser processing machine according to claim 3, wherein the moving device is configured to move the laser head in a three-dimensional direction.

7. A laser processing machine comprising:
   a workpiece conveying device configured to convey a workpiece in a predetermined direction;
   a laser head configured to irradiate the workpiece with a laser;
   a guide member which extends in a direction intersecting a conveying direction of the workpiece and with which the laser head is engaged so as to be movable to one side in the conveying direction;
   a moving device configured to move the laser head along the guide member;
   a counterweight which is movably engaged to the other side of the guide member in the conveying direction and moves along the guide member in a direction opposite to a moving direction of the laser head in conjunction with the laser head moved by the moving device;
   an inspection table which is disposed at a side of the workpiece conveying device and on which inspection of the laser head is performed;
   an ultraviolet irradiation device which is disposed on an opposite side of the inspection table across the workpiece conveying device and on which cleaning of the laser head is performed by ultraviolet irradiation; and
   a grease feeding device disposed diagonally across the guide member with respect to the inspection table or the ultraviolet irradiation device.

* * * * *